United States Patent
Sun et al.

(10) Patent No.: US 8,759,231 B2
(45) Date of Patent: Jun. 24, 2014

(54) SILICON TEXTURE FORMULATIONS WITH DIOL ADDITIVES AND METHODS OF USING THE FORMULATIONS

(75) Inventors: Zhi-Wen Sun, San Jose, CA (US); Sagar Vijay, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 286 days.

(21) Appl. No.: 13/100,692

(22) Filed: May 4, 2011

(65) Prior Publication Data

US 2011/0275222 A1  Nov. 10, 2011

Related U.S. Application Data

(60) Provisional application No. 61/332,649, filed on May 7, 2010, provisional application No. 61/290,858, filed on Dec. 29, 2009.

(51) Int. Cl.
*H01L 21/302* (2006.01)
(52) U.S. Cl.
USPC ............. 438/753; 438/745; 438/750; 216/99
(58) Field of Classification Search
USPC ........ 216/83, 88, 99, 103; 438/745, 753, 750, 438/751, 769; 252/79.1, 79.2
See application file for complete search history.

(56) References Cited

U.S. PATENT DOCUMENTS

| | | | | |
|---|---|---|---|---|
| 4,468,853 A | * | 9/1984 | Morita et al. | 438/72 |
| 8,329,046 B2 | * | 12/2012 | Dove et al. | 216/20 |
| 2005/0065050 A1 | * | 3/2005 | Starzynski | 510/175 |
| 2010/0197144 A1 | * | 8/2010 | Dove et al. | 438/753 |

OTHER PUBLICATIONS

Mayer, Kuno, et al., "New surfactants for combined cleaning and texturing of mono-crystalline silicon wafers after wire-sawing", 23rd European Photovoltaic Solar Energy Conference, Sep. 1-5, 2008, Valencia, Spain, pp. 1109-1113.
Birmann, Katrin, et al., "Fast Alkaline Etching of Monocrystalline Wafers", 23rd European Photovoltaic Solar Energy Conference and Exhibition, Sep. 1-5, 2008, Valencia, Spain, pp. 1-4.

* cited by examiner

*Primary Examiner* — Lan Vinh

(57) ABSTRACT

The present disclosure includes a texture formulation that includes an aliphatic diol, an alkaline compound and water which provides a consistent textured region across a silicon surface suitable for solar cell applications. Processes for texturing a crystalline silicon substrate using these formulations are also described.

18 Claims, 2 Drawing Sheets

SEM at 1000x magnification
40 g/l KOH, 25 g/l 3-methyl-1,5-pentanediol , x g/l DEG, y g/l si@ 90°C, 15 min.

(a) No DEG, 1.4 g/l Si  (b) 35 g/l DEG, 14 g/l Si  ( c ) 60 g/l DEG, 22 g/l Si

SILICON TEXTURE FORMULATIONS WITH DIOL ADDITIVES AND METHODS OF USING THE FORMULATIONS

CROSS REFERENCE TO RELATED APPLICATIONS

The present application claims priority under 35 USC §119 to PCT Application Number PCT/US10/62240 entitled Silicon Texturing Formulations with High Boiling Point Additives and Methods of Using the Formulations, filed Dec. 28, 2010, which claimed priority under 35 USC §119 to U.S. Provisional Application Ser. No. 61/290,858, filed Dec. 29, 2009 and U.S. Provisional Application Ser. No. 61/332,649 filed May 7, 2010. The present application further claims priority under 35 USC §119 to U.S. Provisional Application Ser. No. 61/332,649 filed May 7, 2010. Said PCT Application Number PCT/US10/62240, U.S. Provisional Application Ser. No. 61/290,858 and U.S. Provisional Application Ser. No. 61/332,649 are hereby incorporated by reference in their entireties.

FIELD OF THE INVENTION

The present invention relates generally to the processing of silicon substrates. More specifically, a process and texture solution for texturing a crystalline silicon substrate for use in a silicon based solar cell is described.

BACKGROUND OF THE INVENTION

Silicon based solar cells typically include textured crystalline silicon. A textured crystalline surface may refer to tetragonal pyramids with random pyramid base size in the few micrometer range, where the most desirable size for the pyramid base is 1-5 micrometers (um). The crystalline silicon surface may become textured through application of a texture formulation. A texture formulation may include a mixture of an alkaline chemical, potassium hydroxide (KOH) and isopropyl alcohol (IPA). However, this texture formulation has limitations that prevent the uniform texture formation for efficient solar cells. For example, conventional texture formulations can produce flat, untextured regions or poorly textured regions on the textured surface of the crystalline silicon substrate. Additionally, it is difficult for the conventional texture formulations to control the sizes of the pyramids formed on the surface of the silicon substrate. This is disadvantageous to the operation of a solar cell as light trapping efficiency of the solar cell is not optimal when the pyramid texture is formed of many different sized pyramids and when there are flat untextured regions on the surface of the crystalline silicon substrate.

The use of IPA in the texture formulation provides a narrow process window as IPA has a relatively low boiling point of 82.4° C. A conventional texture formulation which includes KOH and IPA is typically used at a temperature of approximately 80° C. and thus may have a limited texture etch rate due to the low bath temperature that is limited by the low boiling point of IPA. Texture formulations with IPA have a composition which changes with time and may not provide consistent texturing. Furthermore, IPA has a low flashing point of 12° C. which makes IPA a fire hazard. Consequently, an improved texture formulation which provides a consistent textured region across a silicon surface which is not subject to the drawbacks associated with textured formulations which include IPA is desired.

BRIEF DESCRIPTION OF THE DRAWINGS

Various embodiments of the invention are disclosed in the following detailed description and the accompanying drawings.

DETAILED DESCRIPTION

Figure 1:
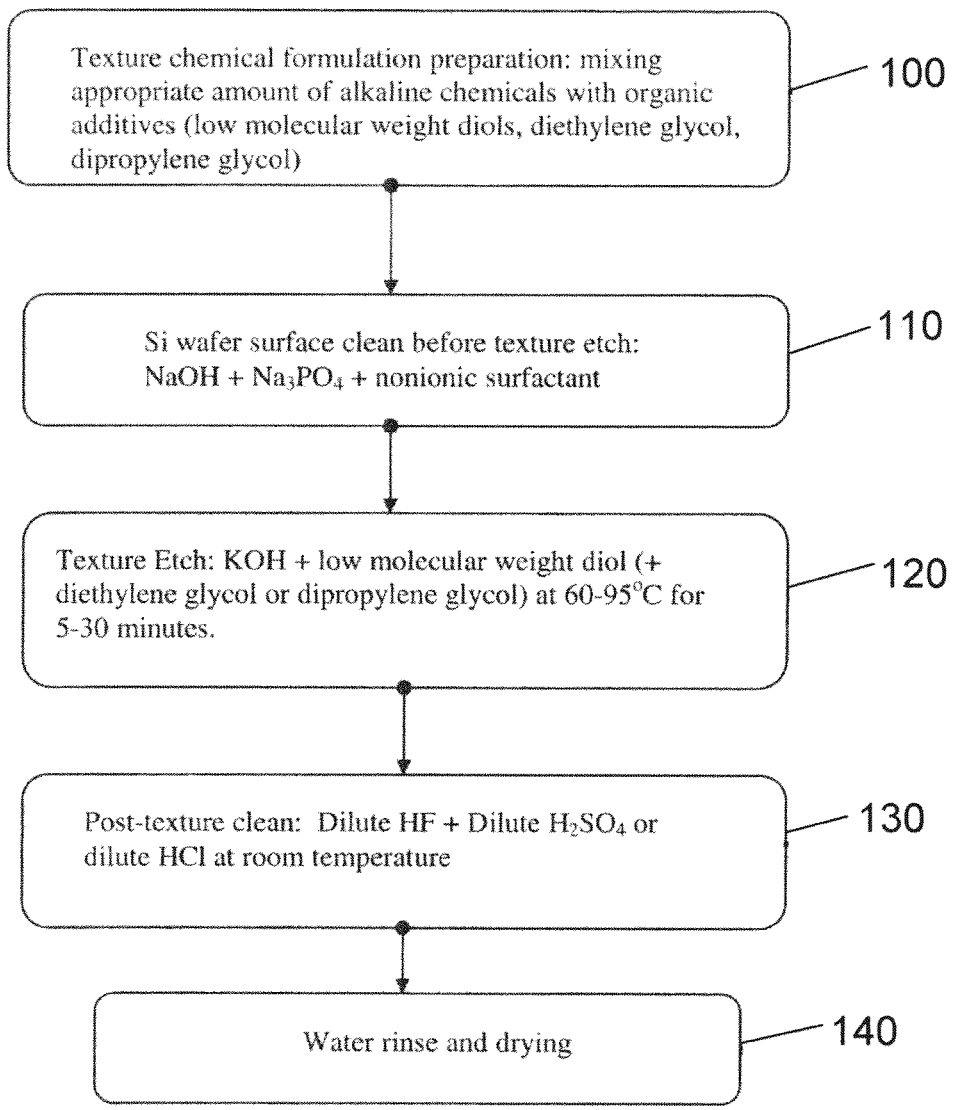
FIG. 1 is a flowchart describing a process for texturing a crystalline silicon substrate.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present disclosure describes a texture formulation that includes a non-cyclic diol. A non-cyclic diol is also known as an aliphatic diol. Diols may be separated into two types, namely cyclic diols and non-cyclic diols. Non-cyclic or aliphatic diols have been found to provide improved functionality in a texture formulation. A diol, also known as a glycol, may refer to a chemical compound containing two hydroxyl groups. Diols have a high boiling point to allow faster texture etch and therefore higher throughput at high temperature. Additionally, the solubility of aliphatic diols in alkaline solution allows easy concentration monitoring and control in production. Furthermore, aliphatic diols have higher flashing point than IPA, they are easily biodegradable and do not constitute environmental hazards which are critical for high volume manufacturing.

Processes for texturing a substrate using these formulations are also described. While the texturing process may be implemented for silicon, it is also contemplated that germanium and other types of substrates may be textured by the texture formulation and texturing processes as described in the present disclosure.

In an embodiment, the texture formulation may be formed of at least one aliphatic diol, an alkaline compound, and water. The texture solution may include any number of aliphatic diols, but may include between one and three, and more particularly between one and two high boiling point additives. The choice of the number of aliphatic diols may be selected such that the texture etch performance can be easily obtained, and at the same time, the chemical concentration monitoring and control can also be realized without excess difficulty. It is contemplated that aliphatic diols with a carbon atom number in the molecular formula of the diols between 4 and 10 may be effective in a silicon texture formulation. The silicon texturing solution may include the aliphatic diols in the volume ratio of 0.2 to 10.0% of the total solution volume, or 2-100 grams per liter (g/L) weight concentration. Without being bound by theory, it is postulated that the aliphatic diols can adsorb on the silicon wafer surface and act as randomly-located etch masks during the pyramid initiation and propagation. The adsorption of the aliphatic diols also greatly lowers surface tension. This may improve uniform texture formation with controllable pyramid sizes. Further, the high boiling points of the aliphatic diols enable the texture etch at high temperature for faster texture etch, and low chemical consumption due to low evaporation loss. Exemplary aliphatic diols may include un-substituted butanediol, pentanediol, hexanediol, heptanediol, and octanediol Alternatively, the aliphatic diols may be the substituted compounds of the above un-substituted compounds with various functional groups such that the total number of carbon atoms in the molecule is greater than 4 but less than or equal to 10. Examples of the substituted diols include, but are not limited to, 3-methyl-1,5-pentanediol, 2-methyl-2,4-pentanediol, 2,2,4-trimethyl-1,3-pentanediol, 1,4-butanediol-diglycidil ether, 1,4-butanediol vinyl ether, 1,4-butanediol divinyl ether, 1,4-butanediol dimethylcrylate, 2-ethyl-1,3-hexanediol, 2,5-dimethyl-2,5-hexanediol.

The alkaline compound of the texture formulation may include KOH, NaOH, TMAH, RbOH, CsOH, or $NH_3OH$ in an amount in the approximate range of 0.2 M-2M (moles per liter). In an embodiment where the alkaline compound is KOH, the KOH may have a concentration in the approximate range of 0.2 M to 1.5 M, and more particularly in the range of 0.4 M to 1.2M. The concentration selected for the alkaline compound relates to other parameters such as temperature of the texture solution and an amount of time that the texture solution is applied to the crystalline silicon substrate, as well as the amount of etched Si built-up in a bath. Size of the pyramids may be tuned by the concentration of the alkaline compound. Also, the concentration of the alkaline compound may remain below a certain limit to ensure true anisotropic etching of the crystalline silicon surface and the formation of pyramids. The crystalline silicon substrate may be, but is not limited to, an epi-type flat silicon wafer or a standard silicon wafer having saw damage layer still remaining on the wafer surface, or a silicon wafer with saw-damage removed by either mechanical or chemical means.

In the instance of a crystalline silicon wafer having saw damage, the silicon texture solution may be formulated to remove wire saw-damage in a separate dedicated step, or as an integral part of 1-step process that accomplishes both the saw damage-removal and the surface texture process within one single step. The term wire-saw damage removal refers to a process of removing the top 2-5 um Si wafer that has been mechanically damaged by the wire sawing process, the removal can be implemented mechanically or chemically. The texture formulation with aliphatic diols may remove any wafer thickness by controlling the etch time and thus may be used for saw-damage removal separately.

Another additive that may be included in the texture solution is chemically dissolved silicon. The dissolved silicon may be added to the texture solution in small amounts to nucleate pyramids and to increase a rate of texture formation. Silicon in different forms may be added into the texture solution in the approximate concentration of 1 g/L to 5 g/L. The forms of silicon include elemental Si such as Si wafers, Si powders, Si pieces; and silicon oxide containing compounds in multiple forms such as silica particles, silica gels, silica powders; and various silane-containing compounds such as TEOS (tetraethoxysilane). Any soluble form of Si and O containing compounds can be used in the texture formulation and the compounds listed above serve only as illustrative examples. Addition of silicon increases the efficiency of the texture formation and controls the pyramid size and its distribution because part of the dissolved silicon in various physical forms can serve as micro-masks for the formation of pyramids, thus the Si concentration can also control the pyramid density as well as the pyramid size. With the addition of silicon to the texture bath formulation, it has been seen that the texture of a surface of a crystalline silicon substrate can be accomplished in less than 5 minutes, the average pyramid size being less than 3 um, suitable for a silicon solar cell application.

In another embodiment, simple organic compounds that can effectively compete with the aforementioned additives to adsorb on the Si surface have been added into the bath formulation to further tune the texture etch rate and the pyramid density and pyramid size. The choice of such compounds depends on the conductivity type of the silicon wafer substrate. For p-type Si with acceptor dopants such as Boron and Ga, low molecular weight carboxylic acids with 2-8 carbon atoms can be used, such acids include, but are not limited to, acetic acid, propionic acid, lactic acid, glycolic acid, glycine, malonic acid, succinic acid, oxalic acid, tartaric acid, adipic acid, malic acid, citric acid, and aspartic acid. A concentration range for such low molecular weight organic carboxylic acid can be 0.05M to 0.5M, or more preferably 0.1M to 0.4M. For n-type Si with donor dopants such as P and As, low molecular weight organic compounds containing surface-active cations such as TMAH and choline can be used, the preferred concentration range being 0.05M to 0.5M, or more preferred in between 0.1M to 0.4M.

In yet another embodiment, additives disclosed herein can be mixed with any additives disclosed in PCT Application Number PCT/US10/62240, which is fully incorporated by reference in its entirety. As an example, a bath formulation containing an aliphatic diol such as 3-methyl-1,5-pentanediol and a derivative of ethylene glycol, diethylene glycol, can be used to texture crystalline silicon wafers with long bath lifetime, to at least 30 g/L dissolved Si. The procedure described in PCT Application Number PCT/US10/62240 for texture bath preparation and bath use in texture process can be used with the sole modification of an aliphatic diol is used here.

The concentrations and amounts for the different components of the formulations may be adjusted based on the intended use of the silicon texture formulations. Also, the concentrations and amounts may be adjusted during scale-up of the silicon texture formulations to manufacturing scale processes. Many of the examples included herein are from formulations developed for research and development. As such, the formulations may be adapted to manufacturing scale processes, either batch processes or in-line processes, according to techniques well known to those in the art.

These additives or combinations of additives may tune the silicon texture formulation to be heated to a temperature in the range of approximately 70° C. to approximately 100° C., and in one particular embodiment a temperature of approximately 90° C. For in-line texturing, the formulation may be tuned to etch in the approximate range of 80° C.-90° C. For batch texturing, the formulation may be tuned to etch in the temperature range of approximately 80° C. since the compounds from each of the families of compounds have boiling points in the range of approximately 130° C. to above 200° C. Because of these high boiling points of the additives, there is minimal evaporation loss during the texturing process when performed at elevated temperatures of 90° C. or above. With minimal evaporation, a need to replenish the additives during processing may be reduced and the lifetime of the silicon texture formulation may be extended. This may be of particular use in volume manufacturing where large volumes of the texture formulation are used in large baths. Large volume manufacturing may include either in-line or batch processing. Additionally, these additives may be advantageous for manufacturing because they are biodegradeable, minimize environment impact and because the lifetimes of the baths are extended by the addition of the additives, disposal requirements are reduced.

In one particular embodiment, the silicon texture solution may be 20 g/L-60 g/L KOH, approximately 20 g/L-30 g/L 3-methyl-1,5-pentanediol, and 0-2 g/L dissolved silicon in the fresh bath formulation. In another embodiment, this same solution may further include diethylene glycol in the approximate amount of 20 g/L-80 g/L for greater lifetime in a process that produces high levels of silica build-up during the texturing process. For example, this silicon texture solution including diethylene glycol may last at least until approximately 30 g/L of silica build-up occurs without any need for "bleed and feed" of the silicon texturing formulation. The term "bleed and feed" refers to a process where portion of the silicon texture solution is first "bled", or drained, due to excessive silica build-up and a significant slowing of the etch rate, and then a fresh silicon texture solution is "fed" to the processing tank. These exemplary silicon texture formulations may be applied to the crystalline silicon substrate at a temperature in the approximate range of 70° C.-95° C. for a time in the approximate range of 10 minutes to 30 minutes. As another example, 4-20 g/L 2-ethyl-1,3-pentanediol and 10-80 g/L diethylene glycol may be dissolved into 20-60 g/L KOH solution, with 0-2 g/L dissolved silicon, to form a stable long lifetime bath able to operate to at least 30 g/L dissolved silicon built-up. This silicon texture formulation may have an etch rate of approximately 0.6-1.0 um/minute per wafer side when maintained at an approximate temperature of 90° C., and uniform texture pattern can be generated. This formulation may also be low maintenance, requiring no replenishment of the additive or of the formulation over time. The additives used in this formulation have a low chemical cost and a low disposal cost.

FIG. 1 shows a flow chart of various embodiments of texturing a crystalline silicon substrate for use in a crystalline silicon based solar cell. In-line or batch processing may include all or some of the individual processes described in the flowchart of FIG. 1. Crystalline silicon based solar cells are much more efficient when the silicon substrate is capable of trapping light because greater conversion of that light to energy can occur. Therefore, it is highly beneficial to texture crystalline silicon substrates as part of the production of solar cells. In block 100, a texture formulation is mixed, including an aliphatic diol, an alkaline compound and water.

In one particular embodiment of the present disclosure, the texturing process may include applying a pre-cleaning solution to a crystalline silicon substrate 110. A monocrystalline silicon substrate may be in a circular wafer form, such as those used in semiconductor processing, or rectangular or square shape for solar wafers, having dimensions of up to 156 mm×156 mm. A thickness of the silicon substrate may also vary. For example, the thickness may be in the range of 80 um and 200 um for solar wafers and in the range of 275 um and 775 um for semiconductor wafers. The pre-cleaning solution may be applied to remove any contaminants from the surface of the substrate that remain after the wafer cutting process or contaminants adhering to the surface during transport and handling of the substrate. The pre-cleaning process may in particular remove heavy organic contaminants such as grease residues from human finger touch that could interfere with the subsequent texturing process. It is hypothesized that the surface organic contaminants can significantly affect the texture solution wetting of the silicon wafer surface and can thus worsen the texture uniformity on the wafer surface and prevent substrate to substrate texture repeatability. The pre-cleaning solution may be a solvent such as acetone that is suitable for removing organic contaminants or a commercial cleaning formulation. In one embodiment, the pre-cleaning solution may be acetone and a surfactant.

In an embodiment where there is a high concentration of grease-like organic contaminants, the pre-cleaning solution may be an alkaline solution containing nonionic or anionic surfactants and organic or inorganic acids. The alkaline component of these solutions may be, for example, KOH, NaOH, or TMAH. The alkaline component serves as the primary degreaser by a soaping process, the non ionic and anionic surfactants serve as additives to help remove the non-soap forming greases, the inorganic or organic acids or their salts can be added as additional additives for organic residue removal An anionic surfactant component may be an organic sulphonic acid and a non-ionic surfactant component may be alkyl benzene poly-oxyethylene with 5-13 ethylene oxide units (e.g. Triton X-120) or alkyl alcohol polyoxyethylene. The surfactant component may serve as primary emulsifiers and dispersants. An organic acid component may be an organo-phosphoric acid such as 1-hydroxy-ethylidene-1,1-diphosphonic acid (HEDP). An inorganic acid component may be a phosphorous acid or a poly-phosphoric acid such as sodium tripolyphosphate ($Na_5P_3O_{10}$) or poly-carboxylic acids such as citric acids. The organic or inorganic acid components may serve as secondary emulsifiers and dispersants. Additionally, a silicate species may be added as an additional emulsifier and dispersant. In one embodiment, the pre-cleaning solution may be NaOH (20 g/L-100 g/L), $Na_3PO_4.12H_2O$ (20 g/L-40 g/L), and Triton X-120 (0.1 g/L-2.0 g/L) at 60° C.-90° C.

The pre-cleaning may be followed by a flowing ozonated water rinse or ozonated water rinse in an ultrasonic bath at heated temperature of 40-65° C., particularly in an embodiment where a surfactant is used, to remove any surfactant remaining on the cleaned surface of the crystalline silicon substrate. Ozonated water here refers to water with less than 30 ppm (part per million, or mg/L) dissolved ozone gas.

At block 120 of the flowchart of FIG. 1 the crystalline silicon substrate is textured with any embodiments of the silicon texture as previously described. In an alternate embodiment, the texturing at block 120 may include more than one texturing bath. For example, a first texturing bath may be used to remove the wire-saw damage layer by faster etch. In some instances, the crystalline silicon substrate may have surface oxidation or wire-saw damage that may require a texture solution with greater etching capabilities to initiate the texturing process. Once the wire saw-damage layer is removed to a satisfactory level (e.g. 80% damage removed) the crystalline silicon substrate may be textured by a second texturing bath with a different formulation from the first bath. The texturing solution may be formulated to tune the resulting texture formed on the surface of the saw-damage removed crystalline silicon substrate. The parameters that may be tuned to control the texture include pyramid height, surface roughness, pyramid distribution, complete texturization of the surface (whether there are any flat untextured areas), pyramid uniformity, pyramid angle, and micro-texture. Also, the texture solution may be formulated to control the whole depth of the silicon etched before the optimized texture quality has been achieved. For example, the whole depth of the silicon etched before optimized texture quality has been achieved may be in the approximate range of 3-10 um, and more preferably in the approximate range of 2-5 um. An optimized pyramid height (perpendicular from base to peak) may be in the approximate range of 2-10 um, and more particularly in the approximate range of 2-5 um. The ability to tune the depth of the silicon etched to achieve the optimized texture quality is advantageous when texturing formulations of the current invention are used to texture very thin substrates of less than 50 um thickness.

Figure 2:
FIG. 2 represents scanning electron microscope photographs of a textured surface of a monocrystalline silicon substrate.

The texture solution may be applied to the crystalline silicon substrate by immersion, spraying, dispense, or curtain dispense. The time that the texturing solution is applied to the crystalline silicon substrate may be in the approximate range of 3 minutes to 40 minutes, and more particularly in the range of 5 minutes to 15 minutes. The amount of time may be related to the temperature of the texture solution because the texturing may be faster at higher temperatures. For example, in a texture solution formed of approximately 20 g/L-60 g/L KOH, approximately 20 g/L-30 g/L 3-methyl-1,5-pentanediol and less than approximately 2 g/L dissolved silica at 80° C., texturing may be complete in approximately less than 20 minutes. For the same silicon texture solution at 90° C., the texturing may be complete in approximately less than 15 minutes. The time and temperature selected may vary depending on the formulation of the silicon texture solution and the texture profile that one is trying to achieve. Examples of the texture formed by this formulation on two different wafers are illustrated in FIG. 2 which are each a SEM (scanning electron microscope) photograph of the textured surface of a monocrystalline silicon substrate.

After texturing, a post-texturing cleaning solution may be applied to the crystalline silicon substrate at block 130 of the flowchart in FIG. 1 to remove the texture solution and any residues from the surface of the substrate, especially inorganic metallic contaminants, such as Fe, Cu, Cr, Ni, Ti, Ca, Mg, that can play the role of charge carrier lifetime killer and significantly adversely impact the energy conversion efficiency of the silicon solar cell. The post-texturing cleaning solution may be a dilute acid solution to remove any silicate gel residues and metallic contaminants from the crystalline silicon substrate surface post-texturing. A dilute acid solution may also serve to neutralize the alkaline residue left on silicon wafer surface to stop the further texturing of the substrate. The dilute acid solution may be, for example, dilute hydrofluoric (HF) acid, a dilute hydrochloric acid (HCl), or a mixture of dilute HF and dilute HCl. The dilute HF in water solution may have a limited concentration to prevent etch of the silicon. The dilute acid solution may be applied to the crystalline silicon substrate for a time sufficient to neutralize the alkaline texturing solution and to remove the inorganic contaminants.

At block 140 of the flowchart in FIG. 1 a water rinse may be applied to the crystalline silicon substrate to remove all chemicals remaining after the texturing of block 120 or the post-texture clean of block 130. The water rinse may be deionized water applied to the surface of the crystalline silicon substrate for a time sufficient to rinse away any chemicals and remaining residues. In particular, a hot water rinse at temperature of 40-65° C. may be applied. The crystalline silicon substrate may be dried to complete a texturing process sequence. The drying may be performed by a spin-dry, a dry air blower, a dry nitrogen blower, hot air dry, a marangoni dry, IPA vapor dry, or any drying methods that can be applied to the thin silicon solar wafers.

Solar cells may subsequently be formed from the textured crystalline silicon substrate. The texturing may be optimized to maximize the light trapping capabilities of the solar cells. The texturing solutions described above may be optimized to tune the textured surface to have a predetermined texture profile that can provide maximized light trapping for a given solar cell design. The optimization of the silicon texturing solution may be accomplished by a combinatorial workflow developed to screen many silicon texturing solutions having different compositions, temperatures, and application times to a crystalline silicon substrate.

It is contemplated that combinatorial processing may be employed to optimize a texturing solution to provide the optimal light-trapping texture on the surface of a crystalline silicon substrate. Combinatorial processing, in embodiments of the present disclosure, includes multiple levels of screening to select the texture solutions for further variation and optimization.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of texturing a crystalline-silicon (c-Si) substrate, comprising:
    texturing a c-Si substrate with a texture solution consisting essentially of water, an at least one aliphatic diol, an alkaline compound and a derivative compound of ethylene glycol or propylene glycol;
    wherein the aliphatic diol comprises 4-10 carbon atoms; and
    wherein the texturing forms a surface covered with pyramid structures.

2. The method of claim 1, wherein the substrate comprises a wafer and the wafer is textured for a time sufficient to remove saw damage and to produce a plurality of pyramids.

3. The method of claim 1, wherein the texture solution is applied to the c-Si substrate for approximately 30 minutes or less.

4. The method of claim 1, further comprising:
    maintaining a temperature of the texture solution of approximately 80-90° C. during the texturing of the c-Si substrate.

5. The method of claim 1, wherein the c-Si substrate comprises a monocrystalline substrate.

6. The method of claim 1, further comprising:
    applying a dilute acid rinse to the c-Si substrate after applying the texturing solution to neutralize the texture solution.

7. The method of claim 1, further comprising:
    applying a water rinse to the c-Si substrate after texturing the c-Si substrate.

8. The method of claim 1, wherein the aliphatic diol is at least one of butanediol, pentanediol, hexanediol, heptanediol, octanediol, and derivatives, the derivatives include at least one of 3-methyl-1,5-pentanediol, 2-methyl-2,4-pentanediol, 2,2,4-trimethyl-1,3-pentanediol, 2-ethyl-1,3-pentanediol, and 2,5-dimethyl-2,5-hexanediol.

9. The method of claim 1, wherein the derivative of ethylene glycol is diethylene glycol.

10. The method of claim 1, wherein the ethylene glycol derivative comprises an ethylene glycol ether derivative and diethylene glycol.

11. The method of claim 1, wherein the propylene glycol derivative comprises a propylene glycol ester derivative.

12. The method of claim 1, wherein the texture solution further comprises chemically dissolved silicon.

13. The method of claim 1, further comprising:
    pre-cleaning the c-Si substrate with a pre-cleaning solution to remove organic contaminants before texturing the c-Si substrate with the texture solution.

14. The method of claim 13, further comprising applying an ozonated water rinse or ozonated water rinse in an ultrasonic bath at heated temperature of 40-65° C.

15. The method of claim 13, wherein the pre-cleaning solution includes alkaline chemicals, inorganic or organic acid additives, and at least one of nonionic or anionic surfactants.

16. The method of claim 15, wherein the alkaline chemicals of the pre-cleaning solution include at least one of NaOH, KOH, TMAH, or $NH_4OH$.

17. The method of claim 15, wherein the nonionic surfactants comprise alkyl benzene polyoxyethylene with 5-13 ethylene oxide units.

18. The method of claim 15, wherein the anionic surfactants comprise sulfonic acid.

* * * * *